(12) United States Patent
Guo et al.

(10) Patent No.: US 10,249,714 B2
(45) Date of Patent: *Apr. 2, 2019

(54) METHOD OF FORMING EPITAXIAL BUFFER LAYER FOR FINFET SOURCE AND DRAIN JUNCTION LEAKAGE REDUCTION

(71) Applicants: INTERNATIONAL BUSINESS MACHINES CORPORATION, Armonk, NY (US); RENESAS ELECTRONICS CORPORATION, Kanagawa (JP)

(72) Inventors: Dechao Guo, Niskayuna, NY (US); Shogo Mochizuki, Clifton Park, NY (US); Andreas Scholze, Colchester, VT (US); Chun-Chen Yeh, Clifton Park, NY (US)

(73) Assignees: INTERNATIONAL BUSINESS MACHINES CORPORATION, Armonk, NY (US); RENESAS ELECTRONICS CORPORATION, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/634,411

(22) Filed: Jun. 27, 2017

(65) Prior Publication Data
US 2017/0294510 A1 Oct. 12, 2017

Related U.S. Application Data

(60) Continuation of application No. 15/170,273, filed on Jun. 1, 2016, now Pat. No. 9,786,661, which is a (Continued)

(51) Int. Cl.
*H01L 29/08* (2006.01)
*H01L 21/8234* (2006.01)
(Continued)

(52) U.S. Cl.
CPC ...... *H01L 29/0847* (2013.01); *H01L 21/2252* (2013.01); *H01L 21/324* (2013.01);
(Continued)

(58) Field of Classification Search
CPC ......... H01L 29/66636; H01L 29/66795; H01L 29/66545; H01L 29/0843
See application file for complete search history.

(56) References Cited

U.S. PATENT DOCUMENTS 6,943,407 B2   9/2005   Ouyang et al.
6,977,194 B2   12/2005  Belyansky et al.
(Continued)

OTHER PUBLICATIONS

Shang, H., et al., "Germanium Channel MOSFETs: Opportunities and Challenges." IBM Journal of Research and Development. vol. 50, No. 4/5, Jul. 2006. (10 Pages).

*Primary Examiner* — Dung A. Le
(74) *Attorney, Agent, or Firm* — Tutunjian & Bitetto, P.C.; Vazken Alexanian

(57) ABSTRACT

A semiconductor device including a gate structure on a channel region portion of a fin structure, and at least one of an epitaxial source region and an epitaxial drain region on a source region portion and a drain region portion of the fin structure. At least one of the epitaxial source region portion and the epitaxial drain region portion include a first concentration doped portion adjacent to the fin structure, and a second concentration doped portion on the first concentration doped portion. The second concentration portion has a greater dopant concentration than the first concentration doped portion. An extension dopant region extending into the channel portion of the fin structure having an abrupt dopant concentration gradient of n-type or p-type dopants of 7 nm per decade or greater.

16 Claims, 6 Drawing Sheets

Related U.S. Application Data division of application No. 14/610,653, filed on Jan. 30, 2015, now Pat. No. 9,390,976.

(60) Provisional application No. 61/987,180, filed on May 1, 2014.

(51) Int. Cl.

| | | |
|---|---|---|
| *H01L 29/66* | (2006.01) | |
| *H01L 29/78* | (2006.01) | |
| *H01L 29/165* | (2006.01) | |
| *H01L 21/225* | (2006.01) | |
| *H01L 21/324* | (2006.01) | |
| *H01L 27/088* | (2006.01) | |
| *H01L 29/267* | (2006.01) | |

(52) U.S. Cl.
CPC ........... *H01L 21/823418* (2013.01); *H01L 21/823431* (2013.01); *H01L 21/823437* (2013.01); *H01L 27/0886* (2013.01); *H01L 29/08* (2013.01); *H01L 29/086* (2013.01); *H01L 29/0843* (2013.01); *H01L 29/0869* (2013.01); *H01L 29/0878* (2013.01); *H01L 29/0886* (2013.01); *H01L 29/165* (2013.01); *H01L 29/66* (2013.01); *H01L 29/66545* (2013.01); *H01L 29/66636* (2013.01); *H01L 29/66681* (2013.01); *H01L 29/66795* (2013.01); *H01L 29/7816* (2013.01); *H01L 29/7833* (2013.01); *H01L 29/7848* (2013.01); *H01L 29/7851* (2013.01); *H01L 29/267* (2013.01)

(56) References Cited

U.S. PATENT DOCUMENTS

| | | |
|---|---|---|
| 8,048,723 B2 | 11/2011 | Chang et al. |
| 8,106,459 B2 | 1/2012 | Chang et al. |
| 8,236,661 B2 | 8/2012 | Dennard et al. |
| 8,377,783 B2 | 2/2013 | Shifren et al. |
| 8,394,690 B2 | 3/2013 | Ikeda et al. |
| 8,421,162 B2 | 4/2013 | Shifren et al. |
| 9,390,976 B2* | 7/2016 | Guo ............... H01L 29/7833 |
| 2011/0169049 A1 | 7/2011 | Loo et al. |
| 2013/0056795 A1* | 3/2013 | Wu ............... H01L 29/66795 257/191 |
| 2014/0057405 A1* | 2/2014 | Zhou ............... H01L 29/7816 438/286 |
| 2014/0151761 A1* | 6/2014 | Hsieh ............ H01L 29/66545 257/288 |
| 2015/0041911 A1 | 2/2015 | Chan et al. |
| 2016/0190137 A1 | 6/2016 | Tsai et al. |
| 2016/0211262 A1 | 7/2016 | Jan et al. |

* cited by examiner

METHOD OF FORMING EPITAXIAL BUFFER LAYER FOR FINFET SOURCE AND DRAIN JUNCTION LEAKAGE REDUCTION

BACKGROUND

Technical Field

The present disclosure relates generally to semiconductor fabrication, and more particularly to structures and methods for forming fin field effect transistors (finFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink. However, the cost of manufacturing SOI finFETs can be high.

SUMMARY

In one embodiment, a method of forming a semiconductor device is disclosed that includes forming a fin structure from a bulk semiconductor substrate. The upper surface of the fin structure is provided by an upper surface of the bulk semiconductor substrate and a length of a sidewall of the fin structure extends from the upper surface of the fin structure to a recessed surface of the bulk semiconductor substrate present at a base of the fin structure. An undoped epitaxial semiconductor material is formed on the fin structure. A first portion of undoped epitaxial semiconductor material is formed on the sidewall of at least one of a source region portion and a drain region portion of the fin structure. A second portion of the undoped epitaxial semiconductor material is formed on the recessed surface of the bulk semiconductor substrate that is present at the base of the fin structure. A doped epitaxial semiconductor material is formed on the undoped epitaxial semiconductor material. The undoped epitaxial semiconductor material and the doped epitaxial semiconductor material provide a source region and drain region to the semiconductor device including the fin structure.

In another embodiment, the method of forming the semiconductor device includes forming a plurality of fin structures from a bulk semiconductor substrate. The length of a sidewall for each fin structure of the plurality of fin structures extends from the upper surface of the fin structure to a recessed surface of a bulk semiconductor substrate present between adjacent fin structures of the plurality of fin structures. An undoped epitaxial semiconductor material is formed on the plurality of fin structures. A first portion of undoped epitaxial semiconductor material is formed on at least a portion of the sidewall of a source region portion and a drain region portion of the fin structures. A second portion of the undoped epitaxial semiconductor material is formed on the recessed surface of the bulk semiconductor substrate that is present between the adjacent fin structures. A doped epitaxial semiconductor material is formed on the undoped epitaxial semiconductor material. The undoped epitaxial semiconductor material and the doped epitaxial semiconductor material provide a merged source region and a merged drain region to the adjacent fin structures of the semiconductor device.

In yet another aspect, a semiconductor device is provided that includes a gate structure on a channel region portion of a fin structure. At least one of an epitaxial source region and an epitaxial drain region are present on a source region portion and a drain region portion of the fin structure. At least one of the epitaxial source region portion and the epitaxial drain region portion include a first concentration doped portion adjacent to the fin structure, and a second concentration doped portion on the first concentration doped portion. The second concentration portion has a greater dopant concentration than the first concentration doped portion. An extension dopant region extends from the source region portion and the drain region portion of the fin structure into the channel portion of the fin structure having an abrupt dopant concentration gradient of n-type or p-type dopants of 7 nm per decade or greater.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
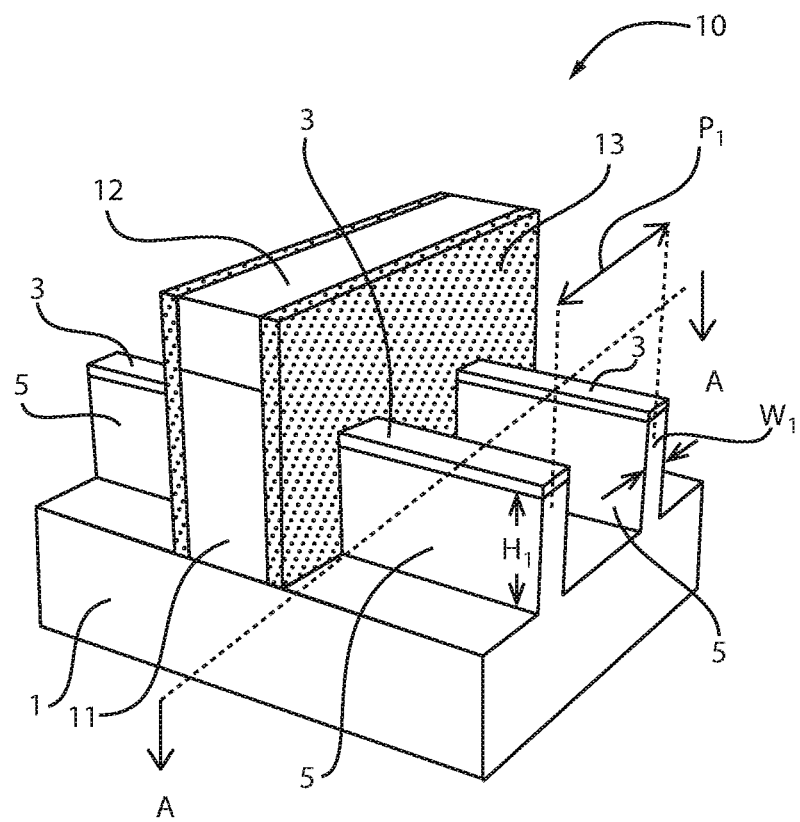
FIG. 1 is a perspective view depicting forming a replacement gate structure on a plurality of fin structures that are formed from a bulk semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It has been determined that in finFET semiconductor devices formed on bulk semiconductor substrates that source and drain region punch through leakage and junction leakage have become a critical concern. In some embodiments, performing a fin recess etch at the source and drain region portions of the fin structures prior to epitaxial growth of the semiconductor material for the source and drain regions is preferred to provide a uniform junction extending from the top of the fin structure to the base of the fin structure. Typically, a sharp, i.e., abrupt, junction profile is preferred at the source and drain region portions of the fin structure to a channel region portion of the fin structure to provide a balance of reduced short channel effects (SCE) and low extension region resistance (Rext). However, a sharp dopant profile at the base of the fin structure can give rise to junction leakage.

In some embodiments, the methods and structures disclosed herein form a buffer layer, i.e., undoped epitaxial semiconductor layer, on the sidewalls of the source region portion and the drain region portion of fin structures formed from bulk semiconductor substrates to reduce source and drain junction leakage. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A "bulk semiconductor substrate" is a substrate that is composed of a single semiconductor material. This is distinguished from a semiconductor on insulator (SOI) substrate that includes a buried dielectric layer underlying an upper semiconductor layer, i.e., semiconductor on insulator (SOI) substrate. In some embodiments, the methods and structures disclosed herein provide a buffer layer having a thin sidewall portion on the sidewalls of the source and drain region portions of the fin structure and a thick base portion between the adjacent fin structures. The buffer layer may be undoped, i.e., have no p-type or n-type dopant, or the buffer layer may be lightly doped, i.e., have a dopant concentration of n-type or p-type dopants that is no greater than $1\times10^{19}$ atoms/cm$^3$ to $5\times10^{19}$ atoms/cm$^3$. The methods and structures of the present disclosure are now discussed with more detail referring to FIGS. 1-6.

Figure 2:
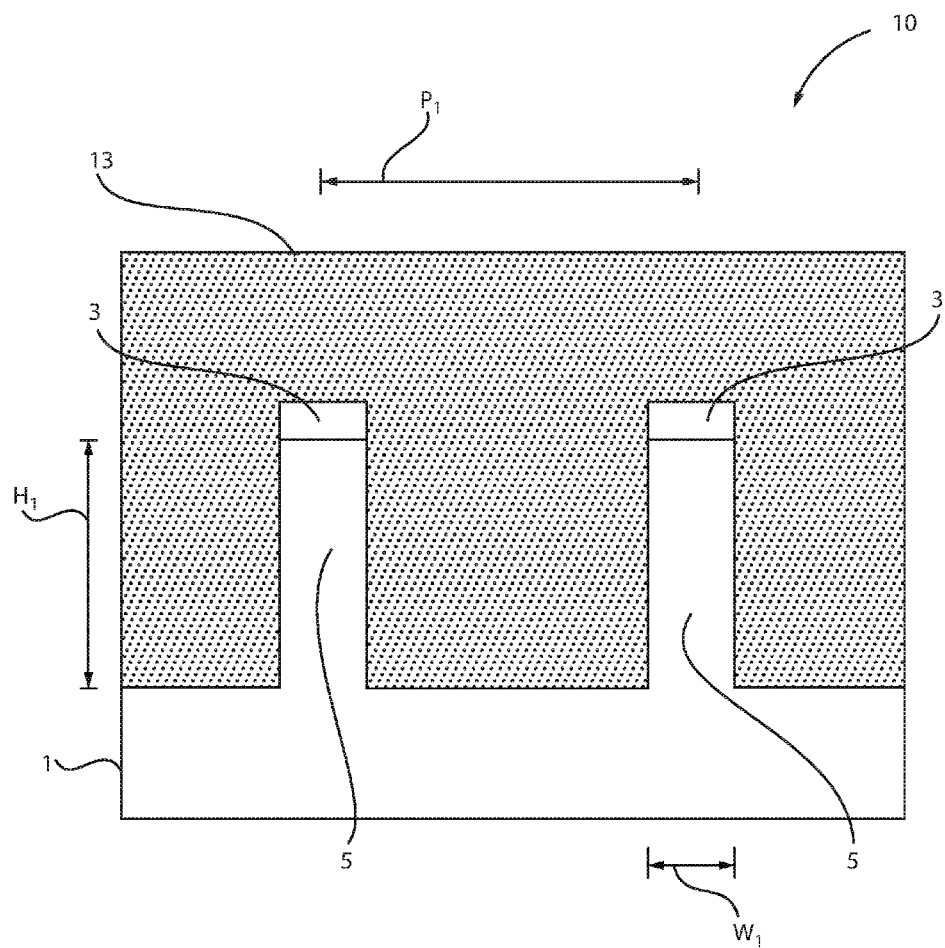
FIG. 2 is a side cross-sectional view along section line A-A (cross section perpendicular to the fin structures) of the structure depicted in FIG. 1.

FIGS. 1 and 2 depict a replacement gate structure 10 that is present on a plurality of fin structures 5 that have been formed from a bulk semiconductor substrate 1. The semiconductor material that provides the bulk semiconductor substrate 1 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The plurality of fin structures 5 may be formed from the bulk semiconductor substrate 1 using photolithography and etch processes. For example, prior to etching the bulk semiconductor substrate 1 to provide the plurality of fin structures 5, a layer of the dielectric material is deposited atop the upper surface of the bulk semiconductor substrate 1 to provide a dielectric fin cap 3. The material layer that provides the dielectric fin cap 3 may be composed of a nitride, oxide, oxynitride material, and/or any other suitable dielectric layer. The dielectric fin cap 3 may comprise a single layer of dielectric material or multiple layers of dielectric materials. The material layer that provides the dielectric fin cap 3 can be formed by a deposition process, such as chemical vapor deposition (CVD) and/or atomic layer deposition (ALD). Alternatively, the material layer that provides the dielectric fin cap 3 may be formed using a growth process, such as thermal oxidation or thermal nitridation. The material layer that provides the dielectric fin cap 3 may have a thickness ranging from 1 nm to 100 nm. In one example, the dielectric fin cap 3 is composed of an oxide, such as SiO$_2$, that is formed by CVD to a thickness ranging from 25 nm to 50 nm.

In one embodiment, following the formation of the layer of dielectric material that provides the dielectric fin cap 3, a photolithography and etch process sequence is applied to the material layer for the dielectric fin cap 3 and the bulk semiconductor substrate 1. Specifically, in one example, a photoresist mask is formed overlying the layer of the dielectric material that provides dielectric fin cap 3 and is present overlying the bulk semiconductor substrate 1, in which the portion of the dielectric material that is underlying the photoresist mask provides the dielectric fin cap 3, and the portion of the bulk semiconductor substrate 1 that is underlying the photoresist mask provides the plurality of fin structures 5. The exposed portions of the dielectric material that provides dielectric fin cap 3 and the portion of the bulk semiconductor substrate 1 that are not protected by the photoresist mask are removed using a selective etch process. To provide the photoresist mask, a photoresist layer is first positioned on the layer of the dielectric material that provides dielectric fin cap 3. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 3 followed by removing a portion of the exposed bulk semiconductor substrate 1 selectively to the photoresist mask. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height of the fin structures 5. In some embodiments, following etching of the bulk semiconductor substrate 1 to define the fin structures 5, the dielectric fin cap 3 may be removed by a selective etch.

The upper surface of the fin structures 5 is provided by an upper surface of the bulk semiconductor substrate 1 that is under the dielectric fin cap 3 and is therefore not etched. The etched portions of the bulk semiconductor substrate 1 are recessed surfaces relative to the upper surface of the fin structure 5. The sidewall of the fin structure 5 extends from the recessed surfaces of the bulk semiconductor substrate 1 to the upper surface of the fin structure 5 that is provided by an upper surface of the bulk semiconductor substrate 1.

Each of the fin structures 5 may have a height $H_1$ ranging from 5 nm to 200 nm. In another embodiment, each of the fin structures 5 has a height $H_1$ ranging from 10 nm to 100 nm. In one example, each of the fin structures 5 has a height $H_1$ ranging from 20 nm to 50 nm. Each of the plurality of fin structures 5 may have a width $W_1$ of less than 20 nm. In another embodiment, each of the fin structures 5 has a width $W_1$ ranging from 3 nm to 8 nm. Although two fin structures 5 are depicted in FIG. 1, the present disclosure is not limited to only this example. It is noted that any number of fin structures 5 may be formed from the bulk semiconductor substrate 1. The pitch P1 separating adjacent fin structures 5 may range from 35 nm to 45 nm. In another example, the pitch P1 separating adjacent fin structures 5 may range from 30 nm to 40 nm.

FIGS. 1 and 2 further depict forming a replacement gate structure 10 on the channel portion of the fin structures 5. As used herein, the term "replacement gate structure" denotes a sacrificial structure that dictates the geometry and location of the later formed functioning gate structure. The "functional gate structure" functions to switch the semiconductor device from an "on" to "off" state, and vice versa. In one embodiment, the replacement gate structure 10 includes a sacrificial gate material 11, and a sacrificial gate cap 12.

In one embodiment, the sacrificial gate material 11 of the replacement gate structure 10 may be composed of any material that can be etched selectively to the fin structures 5 and the isolation region 15. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

In one embodiment, the sacrificial gate material 11 of the replacement gate structure 10 may be composed of a silicon-including material, such as polysilicon. In one embodiment, the sacrificial gate cap 12 may be composed of a dielectric material, such as an oxide, nitride or oxynitride material, or amorphous carbon. The sacrificial materials that provide the sacrificial gate material 11 and the sacrificial gate cap 12 may be patterned and etched to provide the replacement gate structure 10. It is noted that the replacement gate structure 10 is not limited to only the example that is depicted in FIGS. 1 and 2. For example, the replacement gate structure 10 may be composed of any number of material layers and any number of material compositions, so long as the sacrificial gate material 11 can be removed selectively to the plurality of fin structures 5.

Referring to FIGS. 1 and 2, in some embodiments a gate sidewall spacer 13 is formed on the sidewall of the replacement gate structure 10. In one embodiment, the gate sidewall spacer 13 may be formed by using a blanket layer deposition process, such as CVD, and an anisotropic etchback method. The gate sidewall spacer 13 may have a width ranging from 2.0 nm to 15.0 nm, and may be composed of a dielectric, such as a nitride, oxide, oxynitride, or a combination thereof.

Figure 3:
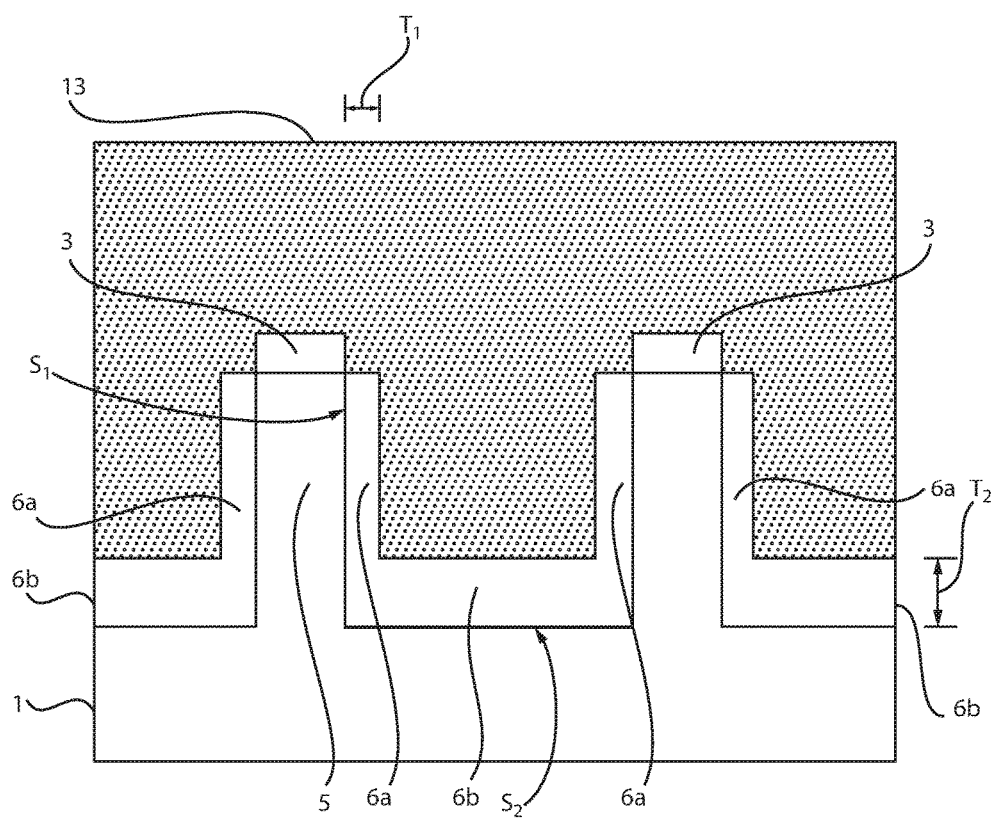
FIG. 3 is a side cross-sectional view perpendicular to the fin structures of forming an undoped epitaxial semiconductor material on the fin structure, in accordance with one embodiment of the present disclosure.

FIG. 3 depicts one embodiment of forming an undoped epitaxial semiconductor material 6a, 6b on the fin structure 5. In some embodiments, a first portion 6a of the undoped epitaxial semiconductor material 6a, 6b is formed on the sidewall S1 of at least one of a source region portion and a drain region portion of the fin structure 5, and a second portion 6b of the undoped epitaxial semiconductor material 6a, 6b is formed on the recessed surface S2 of the bulk semiconductor substrate 1 that is present at the base of the fin structure 5.

In one embodiment, the undoped epitaxial semiconductor material 6a, 6b is formed on the exposed section of the sidewall S1 of the source region portion and the drain region portion of the fin structure 5 and the recessed surface S2 of the bulk semiconductor substrate 1 using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The term "undoped" means that the undoped epitaxial semiconductor material 6a, 6b is substantially free of p-type or n-type dopant. By "substantially free" of p-type or n-type dopant, it is meant that the maximum concentration of p-type or n-type dopant in the undoped epitaxial semiconductor material 6a, 6b is no greater than $5\times10^{15}$ atoms/cm$^3$. In one embodiment, the concentration of n-type or p-type dopant in the undoped epitaxial semiconductor material 6a, 6b may range from $1\times10^{15}$ atoms/cm$^3$ to $5\times10^{15}$ atoms/cm$^3$. In yet another embodiment, the concentration of n-type or p-type dopant in the undoped epitaxial semiconductor material 6a, 6b may be less than $1\times10^{15}$ atoms/cm$^3$. In one example, the undoped epitaxial semiconductor material 6a, 6b is entirely free of p-type or n-type dopants.

In some embodiments, epitaxial deposition of the undoped epitaxial semiconductor material 6a, 6b is a selective deposition process. For example, although the epitaxially deposited the undoped epitaxial semiconductor material 6a, 6b orientates to the crystal arrangement of a semiconductor material and is deposited thereon, such as the exposed sidewall surface S1 of the fin structures 5, the epitaxially deposited undoped epitaxial semiconductor material 6a, 6b may not be deposited on a dielectric material. For example, the undoped epitaxial semiconductor material 6a, 6b is not formed on the sacrificial gate cap 12, the dielectric fin cap 3 and the gate sidewall spacer 13.

In another embodiment, during the epitaxial deposition of the undoped epitaxial semiconductor material 6a, 6b on the fin structures 5, amorphous semiconductor material is deposited on dielectric surfaces, such as the sacrificial gate cap 12, the dielectric fin cap 3 and the gate sidewall spacer 13. The amorphous semiconductor material that is formed on the dielectric surfaces may be removed selectively, e.g., selectively etched, to the undoped epitaxial semiconductor material 6a, 6b formed on the exposed sidewalls of the fin structures 5.

In some embodiments, the undoped epitaxial semiconductor material 6a, 6b may be composed of a germanium-containing semiconductor. The germanium-containing semiconductor of the undoped epitaxial semiconductor material 6a, 6b may include greater than 20 at. % germanium. In some embodiments, the germanium-containing semiconductor of the undoped epitaxial semiconductor material 6a, 6b may have a germanium content that is 30 at. % or greater. In some examples, the germanium content of the germanium-containing semiconductor may range from 35 at. % to 55 at. %. In another example, the germanium content of the germanium-containing semiconductor may range from 40 at. % to 50 at. %. In one embodiment, the undoped epitaxial semiconductor material 6a, 6b is composed of germanium, silicon germanium, a silicon germanium and carbon alloy (e.g., silicon germanium doped with carbon (SiGe:C), germanium alloys, gallium arsenic, indium arsenic, indium phosphide, as well as other III/V and II/VI compound semiconductors.

In one embodiment, a number of different sources may be used for the epitaxial deposition of the undoped epitaxial semiconductor material 6a, 6b. Examples of germanium including source gasses for epitaxially forming an undoped epitaxial semiconductor material 6a, 6b of a germanium containing semiconductor include germane, digermane, halogermane, dichlorogermane, trichlorogermane, tetrachlorogermane and combinations thereof. The germanium including source gas may be accompanied by a silicon including source gas. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking. In some embodiments, the epitaxial deposition process may be adjusted so that the first portion 6a of the undoped epitaxial semiconductor material 6a, 6b that is formed on the sidewall S1 of at least one of a source region portion and a drain region portion of the fin structure 5 has a first thickness T1, and the second portion 6b of the undoped epitaxial semiconductor material 6a, 6b that is formed on the recessed surface S2 of the bulk semiconductor substrate 1 that is present at the base of the fin structure 5 has a second thickness T2 that is greater than the first thickness T1.

In one embodiment, the first thickness T1 of the first portion 6a of the undoped epitaxial semiconductor material 6a, 6b may range from 2 nm to 6 nm, and the second thickness T2 of the second portion 6b of the undoped epitaxial semiconductor material 6a, 6b may range from 7 nm to 12 nm. In another embodiment, the first thickness T1 of the first portion 6a of the undoped epitaxial semiconductor material 6a, 6b may range from 3 nm to 5 nm, and the second thickness T2 of the second portion 6b of the undoped epitaxial semiconductor material 6a, 6b may range from 8 nm to 10 nm.

In one example, the source gas and vacuum pressure applied during the epitaxial deposition process is selected so that the portion of the epitaxially deposited material, i.e., the first portion 6a of undoped epitaxial semiconductor material 6a, 6b, deposited on the sidewalls S1 of the fin structures 5 has a lesser thickness than the portion of the epitaxial deposited material, i.e., the second portion 6b of the undoped epitaxially deposited material 6a, 6b, that is formed on the recessed surfaces S2 of the bulk semiconductor substrate 1. For example, to provide a greater thickness of epitaxially deposited material on the horizontal surfaces of the bulk semiconductor substrate 1 between the adjacent fin structures 10, than the epitaxially deposited material on the vertical sidewall surfaces S1 of the fin structures 10, the gas source may be selected to be dichlorosilane (DCS) or tetrasilane (SiH$_4$), in which the pressure of the deposition process is equal to 5 Torr or less. In some embodiments, with DCS based epitaxial process when reducing the chamber pressure it may help to achieve asymmetrical thickness on the fin sidewall (thin) and bottom (thick). Even higher delta, i.e., asymmetrical thickness on the fin sidewall (thin) and bottom (thick), may be achieved with a change from DCS to SiH$_4$ based gas that is processed at high pressure environment, e.g., around 5 Torr.

Figure 4:
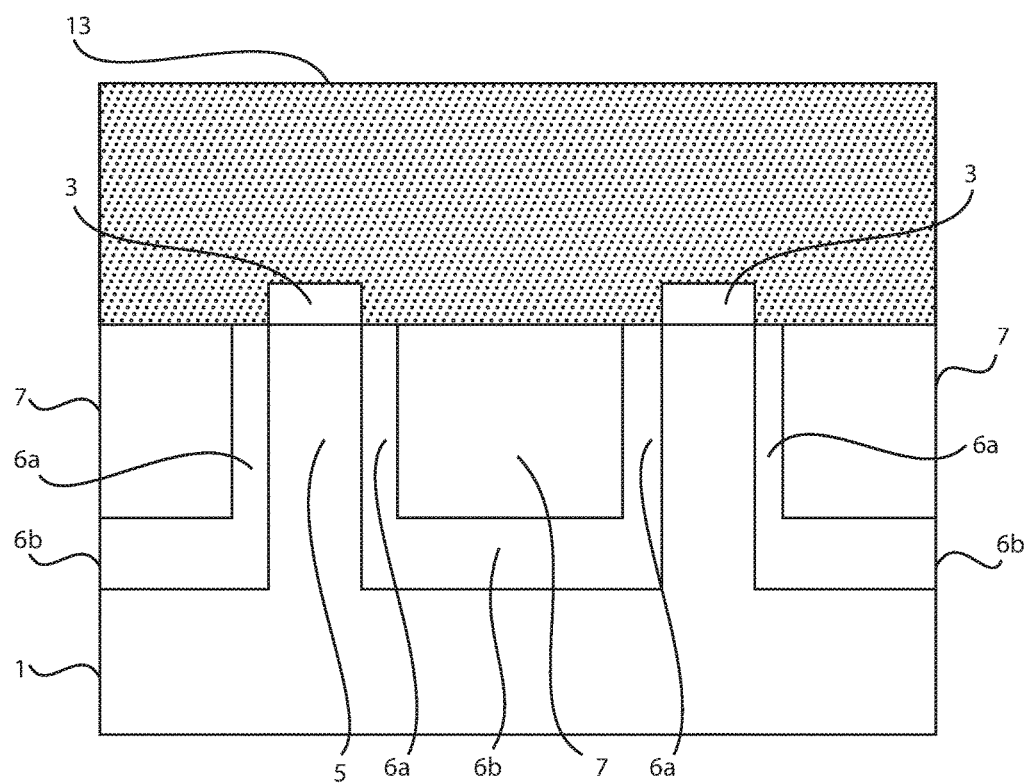
FIG. 4 is a side cross-sectional view perpendicular to the fin structures of forming a doped epitaxial semiconductor material on the undoped epitaxial semiconductor material, in accordance with one embodiment of the present disclosure.

FIG. 4 depicts one embodiment of forming a doped epitaxial semiconductor material 7 on the undoped epitaxial semiconductor material 6a, 6b. By "doped" it is meant that the doped epitaxial semiconductor material 7 includes a p-type or n-type dopant present therein. For example, the concentration of the p-type or n-type dopant in the doped epitaxial semiconductor material 7 may range from $5 \times 10^{20}$ atoms/cm$^3$ to $8 \times 10^{20}$ atoms/cm$^3$. In another example, the concentration of the p-type or n-type dopant in the doped epitaxial semiconductor material 7 may range from $6 \times 10^{20}$ atoms/cm$^3$ to $7 \times 10^{20}$ atoms/cm$^3$.

In the embodiments in which the finFET device being formed has n-type source and drain regions, and is referred to as an n-type finFET, the doped epitaxial semiconductor material 7 is doped with an n-type dopant to have an n-type conductivity. In the embodiments in which the finFET device being formed has p-type source and drain regions, and is referred to as a p-type finFET, the doped epitaxial semiconductor material 7 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

The doped epitaxial semiconductor material 7 may be composed of a germanium-containing semiconductor. The germanium-containing semiconductor of the doped epitaxial semiconductor material 7 may include greater than 20 at. % germanium. In some embodiments, the germanium-containing semiconductor of the doped epitaxial semiconductor material 7 may have a germanium content that is 30 at. % or greater. In some examples, the germanium content of the germanium-containing semiconductor may range from 25 at. % to 55 at. %. In another example, the germanium content of the germanium-containing semiconductor may range from 30 at. % to 50 at. %. In one embodiment, the doped epitaxial semiconductor material 7 is composed of germanium, silicon germanium, a silicon germanium and carbon alloy (e.g., silicon germanium doped with carbon (SiGe:C), germanium alloys, gallium arsenic, indium arsenic, indium phosphide, as well as other III/V and II/VI compound semiconductors.

The doped epitaxial semiconductor material 7 may be formed using an epitaxial deposition process similar to the epitaxial deposition process for forming the undoped epitaxial semiconductor material 6a, 6b that is depicted in FIG. 3. One difference between the epitaxial deposition method for forming the doped epitaxial semiconductor material 7 from the method for forming the undoped epitaxial semiconductor material 6a, 6b is that in forming the doped epitaxial semiconductor material 7 a dopant is introduced to the epitaxially deposited material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$). The source gas for the base material may be provided by germane, digermane, halogermane, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Figure 5:
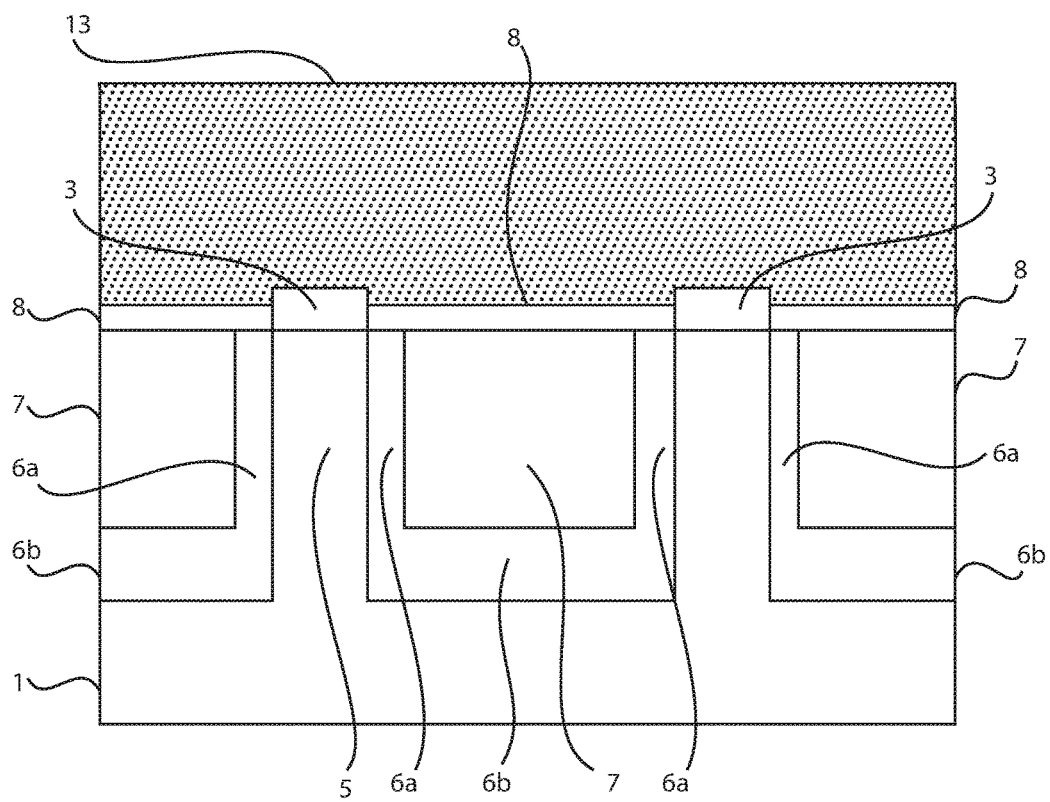
FIG. 5 is a side cross-sectional view perpendicular to the fin structures depicting an epitaxial semiconductor cap being formed on the doped epitaxial semiconductor material, in accordance with one embodiment of the present disclosure.

FIG. 5 depicts one embodiment of forming an epitaxial semiconductor cap 8 on the doped epitaxial semiconductor material 7. In one embodiment, the epitaxial semiconductor cap 8 is composed of a silicon containing material. For example, the epitaxial semiconductor cap 8 may be composed of silicon. In some embodiments, the epitaxial semiconductor cap 8 is doped to have the same conductivity, i.e., p-type or n-type, as the conductivity of the doped epitaxial semiconductor material 7. In other embodiments, the epitaxial semiconductor cap 8 may be undoped.

Figure 6:
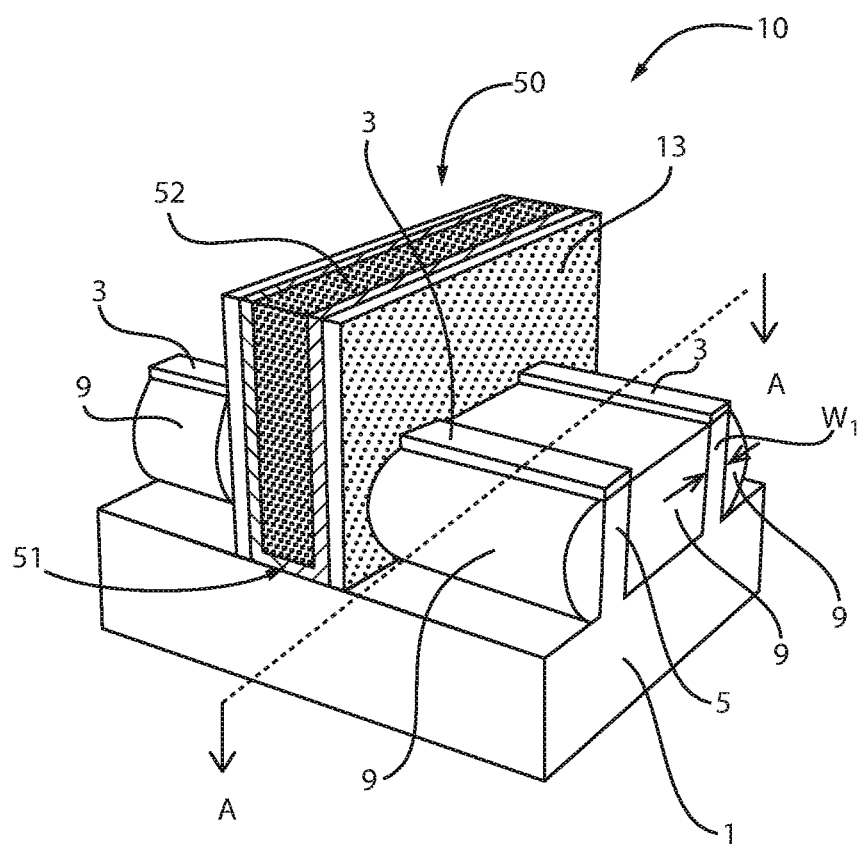
FIG. 6 is a perspective view depicting substituting a functional gate structure for the replacement gate structure, in accordance with one embodiment of the present disclosure.

FIG. 6 depicts one embodiment of diffusing dopant from the epitaxial source and drain region 9 (combination of the undoped epitaxial semiconductor material 6a, 6b, doped epitaxial semiconductor material 7 and the epitaxial semiconductor cap 8) into the fin structures 5 to form an extension dopant region extending into the channel portion of the fin structure 5 having an abrupt dopant concentration gradient of n-type or p-type dopants ranging from 5 nm per decade to 10 nm per decade. In some embodiments, the epitaxial source and drain region 9 extends from a first fin structure to an adjacent second fin structure. The abrupt concentration gradient is measured from the exterior sidewall of the gate sidewall spacer 13 in a direction extending into the channel region of the fin structure 5 from one of the source region portion and drain region portion of the fin structure 5. In one embodiment, the abrupt dopant concentration gradient of n-type or p-type dopants is 7 nm per decade or greater (i.e., less 7 nm per decade, e.g., 6 nm per decade). In one embodiment, the abrupt dopant concentration gradient of n-type or p-type dopants is ranges from 5 nm per decade to 7 nm per decade.

Typically, a greater abruptness is provided by the methods and structures disclosed herein than previously possible, because the buffer layer, i.e., the undoped epitaxial semiconductor material 6a, 6b, being composed of a germanium containing material slows the diffusion of dopants from the doped epitaxial semiconductor material 7 to the fin structures 5. In this manner, a greater concentration of dopant may be present in the doped epitaxial semiconductor material 7 without resulting in a high level of diffusion into the fin structure 5. For example, the fin doping level, which is on the order of $1\times10^{15}$ atoms/cm$^2$, is much lower than the source and drain doping level, which is on the order of $5\times10^{20}$ atoms/cm$^2$ to $8\times10^{20}$ atoms/cm$^2$. If without the buffer layer to suppress the diffusion the dopant gradient can get easily be greater than 10 nm per decade. With the buffer layer in place, the "controlled" diffusion can still provide enough gate to extension overlap but without incurring very poor junction gradient.

In some embodiments, the diffusion, i.e., driving, of the dopant from the doped epitaxial semiconductor material 7 into the extension region portions of the fin structures 5 comprises thermal annealing. In one embodiment, the thermal annealing that diffuses the dopant from the doped epitaxial semiconductor material 7 into the extension region portions of the fin structures 5 includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from doped epitaxial semiconductor material 7 into the extension region portions of the fin structures 5 may include a temperature ranging from 800° C. to 1200° C., and a time period ranging from 10 milliseconds to 100 seconds.

Following the thermal anneal, the combination of the undoped epitaxial semiconductor material 6a, 6b, doped epitaxial semiconductor material 7 and the epitaxial semiconductor cap 8 provide an epitaxial source and drain region 9. In one embodiment, the dopant concentration of n-type or p-type dopant in the portion of the epitaxial source and drain region 9 that is provided by the undoped epitaxial semiconductor material 6a, 6b ranges from $1\times10^{15}$ atoms/cm$^3$ to $5\times10^{15}$ atoms/cm$^3$. In one embodiment, the dopant concentration of n-type or p-type dopant in the portion of the epitaxial source and drain region 9 that is provided by the doped epitaxial semiconductor material 7 ranges from $1\times10^{19}$ atoms/cm$^3$ to $5\times10^{19}$.

FIG. 6 also depicts substituting a functional gate structure 50 for the replacement gate structure after the application of the thermal anneal. In one embodiment, the replacement gate structure 10 may be removed by a selective etch. The replacement gate structure 10 may be removed using a wet or dry etch process. In one embodiment, the replacement gate structure 10 is removed by reactive ion etch (RIE). In one example, an etch step for removing the replacement gate structure 10 can include an etch chemistry for removing the sacrificial gate material 11 and the sacrificial gate cap 12 of the sacrificial replacement gate structure 10 selective to the fin structures 5, and the gate sidewall spacer 13.

A functional gate structure 50 is formed in the space that is provided by removing the replacement gate structure 10. The functional gate structure 50 is formed in direct contact with a channel region portion of the fin structures 5. The functional gate structure 50 typically includes at least one gate dielectric layer 51 and at least one gate conductor layer 52. The at least one gate dielectric layer 51 is typically positioned directly on at least the channel portion of the fin structure 5. The at least one gate dielectric layer 51 may be formed by a thermal growth process, such as, e.g., oxidation, nitridation or oxynitridation. The at least one gate dielectric layer 51 may also be formed by a deposition process, such as, e.g., CVD, plasma-assisted CVD, MOCVD, ALD, evaporation, reactive sputtering, chemical solution deposition and other like deposition processes. The at least one gate dielectric layer 51 may also be formed utilizing any combination of the above processes.

The at least one gate dielectric layer 51 may be comprised of an insulating material having a dielectric constant of about 4.0 or greater. In another embodiment, the at least one gate dielectric layer 51 is comprised of an insulating material having a dielectric constant greater than 7.0. The dielectric constants mentioned herein are relative to a vacuum. In one embodiment, the at least one gate dielectric layer 51 employed in the present disclosure includes, but is not limited to, an oxide, nitride, oxynitride and/or silicates including metal silicates, aluminates, titanates and nitrides. In one example, when the at least one gate dielectric layer 51 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 51 may vary, but typically, the at least one gate dielectric layer 51 has a thickness from 1 nm to 10 nm. In another embodiment, the at least one gate dielectric layer 51 has a thickness from 1 nm to 3 nm.

After forming the material layer for the at least one gate dielectric layer 51, a blanket layer of a conductive material which forms the at least one gate conductor 52 of functional gate structure 50 is formed on the at least one gate dielectric 51 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

In another embodiment, the process sequence for forming the finFET structure depicted in FIG. 6 is formed using a gate first process sequence, which is not depicted in the supplied figures. The method depicted in FIGS. 1-6 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming a fin structure from a semiconductor substrate, wherein an upper surface of the fin structure is provided by an upper surface of the semiconductor substrate and a length of a sidewall of the fin structure extends from the upper surface of the fin structure to a recessed surface of the semiconductor substrate present at a base of the fin structure;
    forming a lightly doped semiconductor material on the fin structure, wherein a portion of the lightly doped semiconductor material is formed on a recessed surface of a semiconductor substrate that is present at the base of the fin structure wherein a dopant concentration in the lightly doped semiconductor material ranges from $1 \times 10^{19}$ to $5 \times 10^{19}$; and
    epitaxially growing a doped semiconductor material on the lightly doped semiconductor material, the doped semiconductor material having a greater dopant concentration than the lightly doped semiconductor material.

2. The method of claim 1, further comprising forming a gate structure on a channel region portion of the fin structure that is between a source region portion and a drain region portion of the fin structure.

3. The method of claim 2, wherein the gate structure is a replacement gate structure comprised of a sacrificial material, wherein the replacement gate structure is removed after diffusing dopant from the doped semiconductor material to the source region portion and the drain region portion of the fin structures; and a functional gate is formed in the place of the replacement gate structure.

4. The method of claim 1, wherein the forming of the lightly doped semiconductor material comprises depositing a first thickness of the lightly doped semiconductor material on an entirety of a sidewall of the source region portion and the drain region portion of the fin structures, and depositing a second thickness of the lightly doped semiconductor material on the recessed surface of the semiconductor substrate, wherein the second thickness is greater than the first thickness.

5. The method of claim 1, wherein the forming of the doped epitaxial semiconductor material on the lightly doped semiconductor material comprises depositing an in situ doped n-type or p-type semiconductor material.

6. The method of claim 1 further comprising applying a thermal anneal to drive n-type or p-type dopant from the doped epitaxial semiconductor material to the source region portion and the drain region portion of the fin structure.

7. A method of forming a semiconductor device comprising:
    forming a lightly doped semiconductor material on a plurality of fin structures, wherein a first portion of the lightly doped semiconductor material is formed on at least a portion of the sidewall a source region portion and a drain region portion of the plurality of fin structures, and a second portion of the lightly doped semiconductor material is formed on a recessed surface of a semiconductor substrate that is present between the adjacent structures; and
    depositing a doped semiconductor material on the lightly doped semiconductor material, wherein the lightly doped semiconductor material and the doped semiconductor material provide at least one of a merged source region and a merged drain region, wherein a dopant concentration in the lightly doped semiconductor material ranges from $1 \times 10^{19}$ to $5 \times 10^{19}$, the doped semiconductor material having a greater dopant concentration than the lightly doped semiconductor material.

8. The method of claim 7 further comprising forming a gate structure on a channel region portion of the plurality of fin structures that is between a source region portion and a drain region portion of the plurality of fin structures.

9. The method of claim 8, wherein the gate structure is formed prior to forming the lightly doped semiconductor material.

10. The method of claim 8, wherein the gate structure is a replacement gate structure comprised of a sacrificial material, wherein the replacement gate structure is removed after diffusing dopant from the doped semiconductor material to the source region portion and the drain region portion of the plurality of fin structures; and a functional gate is formed in the place of the replacement gate structure.

11. The method of claim 7, wherein the forming of the lightly doped semiconductor material comprises depositing a first thickness of the lightly doped semiconductor material on an entirety of the sidewall of the source region portion and the drain region portion of the plurality of fin structures, and depositing a second thickness of the lightly doped epitaxial semiconductor material on the recessed surface of the semiconductor substrate present between adjacent fin structures of the plurality of fin structures.

12. The method of claim 11, wherein the second thickness is greater than the first thickness.

13. The method of claim 7, wherein the depositing of the lightly doped semiconductor material on the lightly doped semiconductor material comprises depositing an in situ doped n-type semiconductor material.

14. The method of claim 7, wherein the forming of the doped epitaxial semiconductor material on the lightly doped epitaxial semiconductor material comprises depositing an in situ doped p-type semiconductor material.

15. The method of claim 7 further comprising applying a thermal anneal to drive the n-type or p-type dopant from the doped semiconductor material to the source region portion and the drain region portion of the fin structures.

16. The method of claim 15, wherein the thermal anneal comprises a temperature ranging from 800° C. to 1200° C.

* * * * *